(12) United States Patent
Wojcik et al.

(10) Patent No.: US 11,195,874 B2
(45) Date of Patent: Dec. 7, 2021

(54) DETACH AND REATTACH OF A FLEXIBLE POLYIMIDE BASED X-RAY DETECTOR

(71) Applicant: CARESTREAM HEALTH, INC., Rochester, NY (US)

(72) Inventors: Timothy J. Wojcik, Rochester, NY (US); Ravi K. Mruthyunjaya, Penfield, NY (US); Bradley S. Jadrich, North Port, FL (US)

(73) Assignee: Carestream Health, Inc., Rochester, NY (US)

( * ) Notice: Subject to any disclaimer, the term of this patent is extended or adjusted under 35 U.S.C. 154(b) by 198 days.

(21) Appl. No.: 16/468,441

(22) PCT Filed: Jan. 4, 2018

(86) PCT No.: PCT/US2018/012332
§ 371 (c)(1),
(2) Date: Jun. 11, 2019

(87) PCT Pub. No.: WO2018/129148
PCT Pub. Date: Jul. 12, 2018

(65) Prior Publication Data
US 2019/0333961 A1  Oct. 31, 2019

Related U.S. Application Data

(60) Provisional application No. 62/443,023, filed on Jan. 6, 2017.

(51) Int. Cl.
*H01L 21/30* (2006.01)
*H01L 21/46* (2006.01)
*H01L 27/146* (2006.01)
*G01T 1/20* (2006.01)
*H01L 27/30* (2006.01)

(52) U.S. Cl.
CPC ...... *H01L 27/14663* (2013.01); *G01T 1/2018* (2013.01); *H01L 27/14636* (2013.01); *H01L 27/308* (2013.01)

(58) Field of Classification Search
None
See application file for complete search history.

(56) References Cited

U.S. PATENT DOCUMENTS

| 2010/0203296 | A1* | 8/2010 | Tsai | H01L 21/6835 428/172 |
| 2015/0060676 | A1 | 3/2015 | Couture et al. | |
| 2016/0204164 | A1 | 7/2016 | Zhao et al. | |
| 2016/0260765 | A1 | 9/2016 | Marrs | |
| 2017/0190910 | A1* | 7/2017 | Uno | C08J 5/18 |

FOREIGN PATENT DOCUMENTS

WO  2013/099652  7/2013

OTHER PUBLICATIONS

International Search Report dated Apr. 5, 2018 for International Application No. PCT/US2018/012332, 2 pages.

* cited by examiner

*Primary Examiner* — Joseph C. Nicely
*Assistant Examiner* — Lamont B Koo

(57) ABSTRACT

An image sensor array formed on a flexible first substrate is supported by a flexible second substrate attached thereto. The second substrate has a top surface with an adhesive thereon for attaching the substrates together. The adhesive is on a portion of the second substrate directly beneath the image sensor array to allow selective formation of the second substrate.

20 Claims, 14 Drawing Sheets

DETACH AND REATTACH OF A FLEXIBLE POLYIMIDE BASED X-RAY DETECTOR

CROSS REFERENCE TO RELATED APPLICATIONS

This application claims the benefit of and is a U.S. National Phase filing of PCT Application PCT/US2018/0012332 filed Jan. 4, 2018 entitled "DETACH AND REATTACH OF A FLEXIBLE POLYIMIDE BASED X-RAY DETECTOR", in the name of Timothy J. Wojcik et al., which claims benefit of U.S. Patent Application Ser. No. 62/443,023, filed Jan. 6, 2017, in the name of Timothy J. Wojcik et al., and entitled DETACH AND RE-LAMINATION OF A POLYIMIDE BASED X-RAY DETECTOR.

BACKGROUND OF THE INVENTION

The subject matter disclosed herein relates to digital radiographic detector panels. In particular, to a DR image array module apparatus and manufacturing methods based on the use of a flexible substrate image sensor array rather than a rigid substrate such as glass.

Typically, amorphous silicon thin film transistors are combined with PIN photodiodes to create an imaging pixel in an array that may be fabricated on glass for large area panel digital radiographic (DR) detectors. Metal oxide TFT technology can also be used in manufacturing processes similar to amorphous silicon.

BRIEF DESCRIPTION OF THE INVENTION

It may be desirable to use flexible, e.g. polyimide (PI), substrates rather than glass substrates for image sensors that are integrated into portable DR detectors to provide non-planar or curved configurations and to improve durability and reduce weight. In one example, an X-ray detector panel process may include fabricating a panel design on a PI layer attached to a traditional glass substrate. The PI layer may be laminated or spin coated on the conventional glass substrate. After the fabrication steps are completed, test verification methods and/or subsequent module assembly steps that work for glass only substrates typically work for PI on glass substrates since the PI on glass substrates are held together throughout the fabrication steps and are not separated.

One post-fabrication step includes detaching the PI panel and re-laminating it to a secondary substrate. The typical detach method may include laser ablation or mechanical release. The steps of detaching and re-laminating onto a secondary substrate may lead to unacceptable performance and defect levels. Proper verification immediately after completion of the detach and reattach process is important and may help to identify those panels which have unacceptable performance or increased defect levels caused by the detach and reattach process steps. Proper evaluation after detach and re-lamination may avoid performing subsequent module assembly steps, and the costs associated therewith, for panels that are properly identified as having unacceptable performance or defect levels.

An image sensor array formed on a flexible first substrate is supported by a flexible second substrate attached thereto. The second substrate has a top surface with an adhesive thereon for attaching the substrates together. The adhesive is on a portion of the second substrate directly beneath the image sensor array to allow selective formation of the second substrate.

In one embodiment, a flexible digital radiographic image sensor includes an image sensor array formed on a flexible first substrate. A flexible second substrate is attached to the first substrate on a side opposite the image sensor array. The second substrate has a top surface with a first adhesive only in a first portion thereof. The adhesive portion contacts the first substrate in an area directly opposite or beneath the image sensor array.

In one embodiment, a method of fabricating a digital radiographic image sensor requires forming an image sensor array on a flexible substrate. The formed image sensor array and flexible are attached a temporary carrier substrate. The image sensor array and flexible substrate are detached from the carrier substrate and are reattached onto a final product substrate.

Processes have been demonstrated for coating a thin (typically 20-50 micron) layer of polyimide (PI) onto a release layer upon a glass carrier that allows the same semiconductor device fabrication processes to be run as if the devices were fabricated directly onto glass. Thus, known glass substrate module assembly process technology can be used, such as panel singulation with electrostatic discharge (ESD) shorting bar removal, scintillator lamination to the image sensor panel, and Chip-on-Film (COF) attach and/or rework on sensor bond pads.

The secondary substrate described herein may also be considered the final product substrate and proper evaluation methods performed using the secondary substrate would not be compromised. In some cases the final product substrate configuration may require products to be lightweight or to use materials that are more compliant and less rigid, or even curved. These attributes may compromise the test verification method and the reliability of performing subsequent module assembly steps. Test verification methods may include a probing system which requires high accuracy alignment for a large number of contact points. Subsequent module assembly steps may include scintillator attachment and Chip-on-Flex (COF) bonding for a large number of contact points.

In the case of the PI coated variation, the image sensor array may be removed from the glass carrier by laser exposure through the glass or by mechanical peeling. After release from the glass, the PI based image array may be laminated to a secondary substrate to provide geometric integrity and improved handling characteristics.

After fabricating the PI based image sensor, additional integration processes may be conducted to create the digital radiographic core imaging subsystem module. These steps include probe testing of the image sensor panel, lamination or direct deposition of a scintillator (typically gadolinium oxysulfide or cesium iodide), disconnection of manufacturing process ESD protection circuitry that may degrade imaging performance due to high leakage current, tape automated bonding (TAB) of readout electronics to the sensor array using anisotropic conducting film (ACF), which may also require the ability to replace a TAB attached readout component if it is determined to be of unacceptable performance, and lamination of a backscatter shielding layer to improve image quality.

On glass based sensor arrays the gate drivers and read out IC COF's are anisotropic conductive film (ACF) bonded to the array connection pads (e.g., TAB pads) in an area adjacent to the image sensor array. To replace one of the COF's, it may not be easy to rework ACF connections to polyimide because the pad adhesion to the polyimide may be more fragile than those being used on glass substrates and it may be destroyed. In the replacement process the COF bond pads are heated, pulled off the flex circuit, sensor pads are cleaned, and another COF may be reattached. The flexible image sensor substrate may be fabricated so the COF pads extend from the main body of the sensor array. Redundant COF pads may be included on this extension so as to allow a simple cut to remove the outer COF Pads, leaving the inner set of bonding pads. To keep the same COF length between the x-ray detector and the printed wiring boards (PWB), redundant pads may also be used on the PWB.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
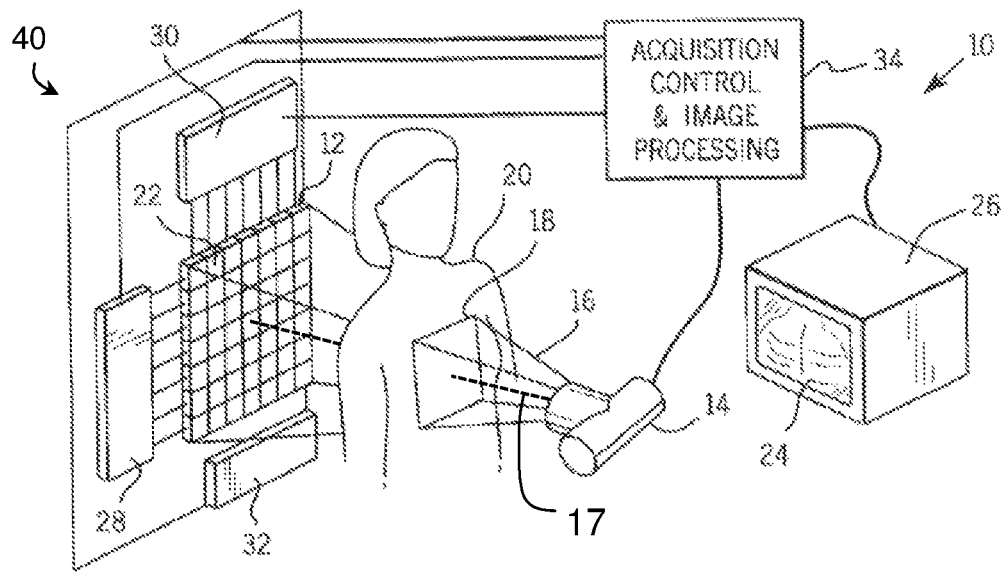
FIG. 1 is a diagram of an exemplary radiographic imaging system.

FIG. 1 is a perspective view of a digital radiographic (DR) imaging system 10 that may include a generally curved or planar DR detector 40 (shown in a planar embodiment and without a housing for clarity of description), an x-ray source 14 configured to generate radiographic energy (x-ray radiation), and a digital monitor 26 configured to display images captured by the DR detector 40, according to one embodiment. The DR detector 40 may include a two dimensional image sensor array 12 of detector cells 22 (photosensors), arranged in electronically addressable rows and columns. The DR detector 40 may be positioned to receive x-rays 16 passing through a subject 20 during a radiographic energy exposure, or radiographic energy pulse, emitted by the x-ray source 14. As shown in FIG. 1, the radiographic imaging system 10 may use an x-ray source 14 that emits collimated x-rays 16, e.g. an x-ray beam, selectively aimed at and passing through a preselected region 18 of the subject 20. The x-ray beam 16 may be attenuated by varying degrees along its plurality of rays according to the internal structure of the subject 20, which attenuated rays are detected by the array 12 of photosensitive detector cells 22. The curved or planar DR detector 40 is positioned, as much as possible, in a perpendicular relation to a substantially central ray 17 of the plurality of rays 16 emitted by the x-ray source 14. In a curved array embodiment, the source may be centrally positioned such that a larger percentage, or all, of the photosensitive detector cells are positioned perpendicular to the incoming x-rays. The image sensor array 12 of individual photosensitive cells (pixels) 22 may be electronically addressed (scanned) by their position according to column and row. As used herein, the terms "column" and "row" refer to the vertical and horizontal arrangement of the photosensor cells 22 and, for clarity of description, it will be assumed that the rows extend horizontally and the columns extend vertically. However, the orientation of the columns and rows is arbitrary and does not limit the scope of any embodiments disclosed herein. Furthermore, the term "subject" may be illustrated as a human patient in the description of FIG. 1, however, a subject of a DR imaging system, as the term is used herein, may be a human, an animal, an inanimate object, or a portion thereof.

In one exemplary embodiment, the rows of photosensitive cells 22 may be scanned one or more at a time by electronic scanning circuit 28 so that the exposure data from the array 12 may be transmitted to electronic read-out circuit 30. Each photosensitive cell 22 may independently store a charge proportional to an intensity, or energy level, of the attenuated radiographic radiation, or x-rays, received and absorbed in the cell. Thus, each photosensitive cell, when read-out, provides information defining a pixel of a radiographic image 24, e.g. a brightness level or an amount of energy absorbed by the pixel, that may be digitally decoded by image processing electronics 34 and transmitted to be displayed by the digital monitor 26 for viewing by a user. An electronic bias circuit 32 is electrically connected to the two-dimensional detector array 12 to provide a bias voltage to each of the photosensitive cells 22.

Each of the electronic bias circuit 32, scanning circuit 28, and read-out circuit 30, may communicate with an acquisition control and image processing unit 34 over a connected cable (wired), or the DR detector may be equipped with a wireless transmitter to transmit radiographic image data wirelessly to the acquisition control and image processing unit 34. The acquisition control and image processing unit 34 may include a processor and electronic memory (not shown) to control operations of the DR detector 40 as described herein, including control of circuits 28, 30, and 32, for example, by use of programmed instructions. The acquisition control and image processing unit 34 may also be used to control activation of the x-ray source 14 during a radiographic exposure, controlling an x-ray tube electric current magnitude, and thus the fluence of x-rays in x-ray beam 16, and/or the x-ray tube voltage, and thus the energy level of the x-rays in x-ray beam 16.

The acquisition control and image processing unit 34 may transmit image (pixel) data to the monitor 26, based on the radiographic exposure data received from the array 12 of photosensitive cells 22. Alternatively, acquisition control and image processing unit 34 can process the image data and store it, or it may store raw unprocessed image data, in local or remotely accessible memory.

With regard to a direct detection embodiment of DR detector 40, the photosensitive cells 22 may each include a sensing element sensitive to x-rays, i.e. it absorbs x-rays and generates an amount of charge carriers in proportion to a magnitude of the absorbed x-ray energy. A switching element may be configured to be selectively activated to read out the charge level of a corresponding x-ray sensing element. With regard to an indirect detection embodiment of DR detector 40, photosensitive cells 22 may each include a sensing element sensitive to light rays in the visible spectrum, i.e. it absorbs light rays and generates an amount of charge carriers in proportion to a magnitude of the absorbed light energy, and a switching element that is selectively activated to read the charge level of the corresponding sensing element. A scintillator, or wavelength converter, may be disposed over the light sensitive sensing elements to convert incident x-ray radiographic energy to visible light energy. Thus, in the embodiments disclosed herein, it should be noted that the DR detector 40 (or DR detector 300 in FIG. 3 or DR detector 400 in FIG. 4) may include an indirect or direct type of DR detector.

Examples of sensing elements used in sensing array 12 include various types of photoelectric conversion devices (e.g., photosensors) such as photodiodes (P-N or PIN diodes), photo-capacitors (MIS), photo-transistors or photoconductors. Examples of switching elements used for signal read-out include a-Si TFTs, oxide TFTs, MOS transistors, bipolar transistors and other p-n junction components.

Figure 2:
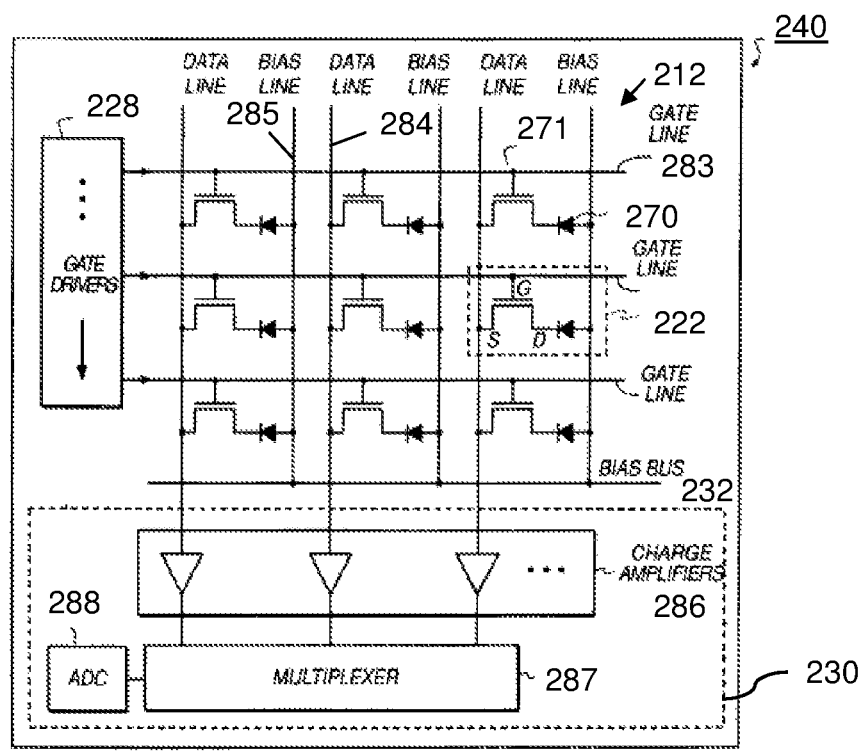
FIG. 2 is a schematic diagram of an imaging array for an exemplary radiographic detector.

FIG. 2 is a schematic diagram 240 of a portion of the two-dimensional image sensor array 12 for a DR detector 40. The array of photosensor cells 212, whose operation may be consistent with the image sensor array 12 described above, may include a number of hydrogenated amorphous silicon (a-Si:H) n-i-p photodiodes 270 and thin film transistors (TFTs) 271 formed as field effect transistors (FETs) each having gate (G), source (S), and drain (D) terminals. In embodiments of DR detector 40 disclosed herein, such as a multilayer DR detector (400 of FIG. 4), the two-dimensional array of photosensor cells 12 may be formed in a device layer that abuts adjacent layers of the DR detector structure, which adjacent layers may include a rigid glass layer or a flexible polyimide layer without any adjacent rigid layers. A plurality of gate driver circuits 228 may be electrically connected to a plurality of gate lines 283 which control a voltage applied to the gates of TFTs 271, a plurality of readout circuits 230 may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly connected to the ADC, to stream out the digital radiographic image data at desired rates. In one embodiment, the schematic diagram of FIG. 2 may represent a portion of a DR detector 40 such as an a-Si:H based indirect flat or curved panel imager.

Incident x-rays, or x-ray photons, 16 are converted to optical photons, or light rays, by a scintillator, which light rays are subsequently converted to electron-hole pairs, or charges, upon impacting the a-Si:H n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 can control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the pn junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DR detector 40 having an imaging array as described with reference to FIG. 2 is capable of both single-shot (e.g., static, radiographic) and continuous (e.g., fluoroscopic) image acquisition.

Figure 3:
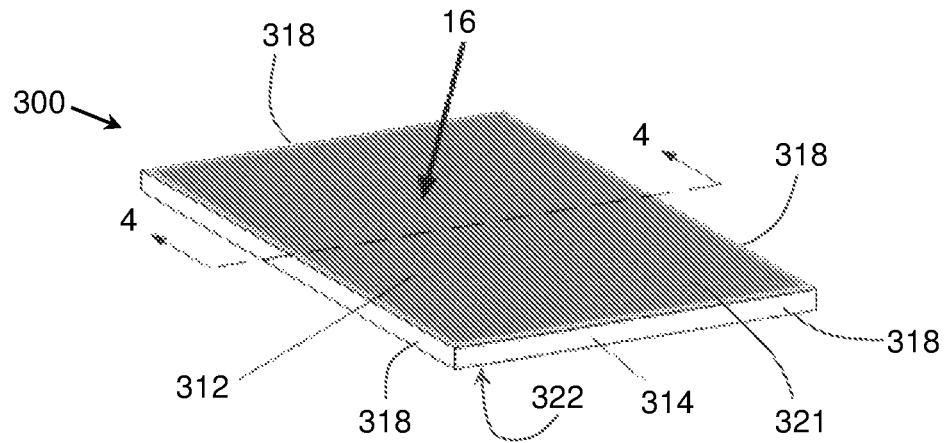
FIG. 3 shows a perspective view of an exemplary portable wireless DR detector.

FIG. 3 shows a perspective view of an exemplary prior art generally rectangular, planar, portable wireless DR detector 300 according to an embodiment of DR detector 40 disclosed herein. The DR detector 300 may include a flexible substrate to allow the DR detector to capture radiographic images in a curved orientation. The flexible substrate may be fabricated in a permanent curved orientation, or it may remain flexible throughout its life to provide an adjustable curvature in two or three dimensions, as desired. The DR detector 300 may include a similarly flexible housing portion 314 that surrounds a multilayer structure comprising a flexible photosensor array portion 22 of the DR detector 300. The housing portion 314 of the DR detector 300 may include a continuous, rigid or flexible, x-ray opaque material or, as used synonymously herein a radio-opaque material, surrounding an interior volume of the DR detector 300. The housing portion 314 may include four flexible edges 318, extending between the top side 321 and the bottom side 322, and arranged substantially orthogonally in relation to the top and bottom sides 321, 322. The bottom side 322 may be continuous with the four edges and disposed opposite the top side 321 of the DR detector 300. The top side 321 comprises a top cover 312 attached to the housing portion 314 which, together with the housing portion 314, substantially encloses the multilayer structure in the interior volume of the DR detector 300. The top cover 312 may be attached to the housing 314 to form a seal therebetween, and be made of a material that passes x-rays 16 without significant attenuation thereof, i.e., an x-ray transmissive material or, as used synonymously herein, a radiolucent material, such as a carbon fiber plastic, polymeric, or other plastic based material.

Figure 4:
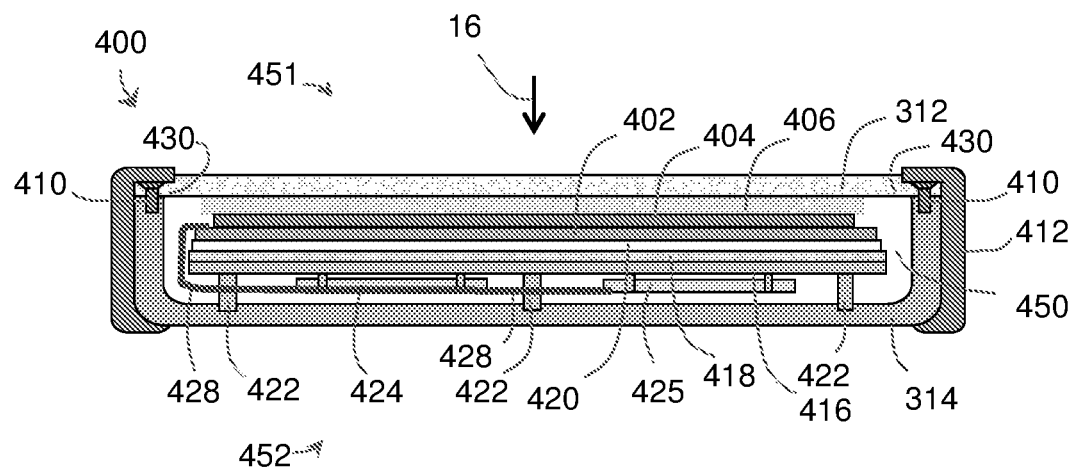
FIG. 4 is a cross section view of FIG. 3.

With reference to FIG. 4, there is illustrated in schematic form an exemplary cross-section view along section 4-4 of the exemplary embodiment of the DR detector 300 (FIG. 3). For spatial reference purposes, one major surface of the DR detector 400 may be referred to as the top side 451 and a second major surface may be referred to as the bottom side 452, as used herein. The multilayer structure may be disposed within the interior volume 450 enclosed by the housing 314 and top cover 312 and may include a flexible curved or planar scintillator layer 404 over a curved or planar the two-dimensional imaging sensor array 12 shown schematically as the device layer 402. The scintillator layer 404 may be directly under (e.g., directly connected to) the substantially planar top cover 312, and the imaging array 402 may be directly under the scintillator 404. Alternatively, a flexible layer 406 may be positioned between the scintillator layer 404 and the top cover 312 as part of the multilayer structure to allow adjustable curvature of the multilayer structure and/or to provide shock absorption. The flexible layer 406 may be selected to provide an amount of flexible support for both the top cover 312 and the scintillator 404, and may comprise a foam rubber type of material. The layers just described comprising the multilayer structure each may generally be formed in a rectangular shape and defined by edges arranged orthogonally and disposed in parallel with an interior side of the edges 318 of the housing 314, as described in reference to FIG. 3.

A substrate layer 420 may be disposed under the imaging array 402, such as a rigid glass layer, in one embodiment, or flexible substrate such as polyimide upon which the array of photosensors 402 may be formed to allow adjustable curvature of the array, and may comprise another layer of the multilayer structure. Under the substrate layer 420 a radio-opaque shield layer 418 may be used as an x-ray blocking layer to help prevent scattering of x-rays passing through the substrate layer 420 as well as to block x-rays reflected from other surfaces in the interior volume 450. Readout electronics, including the scanning circuit 28, the read-out circuit 30, and the bias circuit 32 (all of FIG. 1) may be formed adjacent the imaging array 402 or, as shown, may be disposed below frame support member 416 in the form of integrated circuits (ICs) electrically connected to printed circuit boards 424, 425. The imaging array 402 is electrically connected to the readout electronics 424 (ICs) over a flexible connector 428 which may comprise a plurality of flexible, sealed conductors known as chip-on-film (COF) connectors, which structure and method of connection is described herein.

X-ray flux may pass through the radiolucent top panel cover 312, in the direction represented by an exemplary x-ray beam 16, and impinge upon scintillator 404 where stimulation by the high-energy x-rays 16, or photons, causes the scintillator 404 to emit lower energy photons as visible light rays which are then received in the photosensors of imaging array 402. The frame support member 416 may connect the multilayer structure to the housing 314 and may further operate as a shock absorber by disposing elastic pads (not shown) between the frame support beams 422 and the housing 314. Fasteners 410 may be used to attach the top cover 312 to the housing 314 and create a seal therebetween in the region 430 where they come into contact. In one embodiment, an external bumper 412 may be attached along the edges 318 of the DR detector 400 to provide additional shock-absorption.

Figure 5:
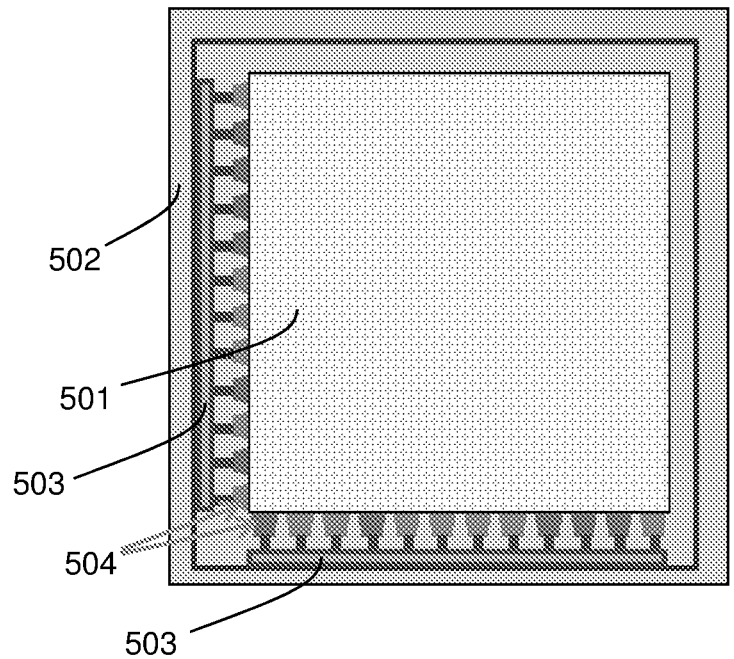
FIG. 5 is a schematic diagram of an image sensor panel fabricated on a glass substrate with an ESD protection circuit.
Figure 6:
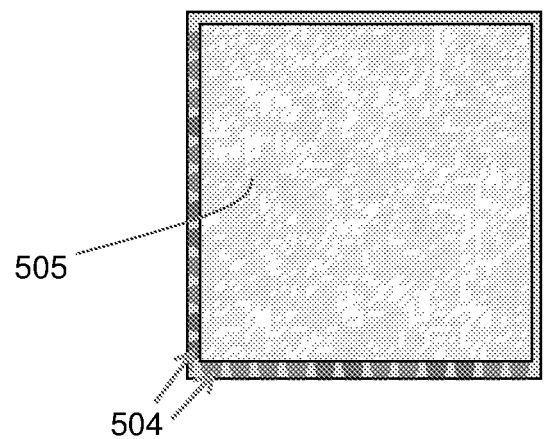
FIG. 6 is a schematic diagram of a scintillator deposited on the sensor array, the ESD circuit disconnected, and the glass substrate cut to a desired size.
Figure 7:
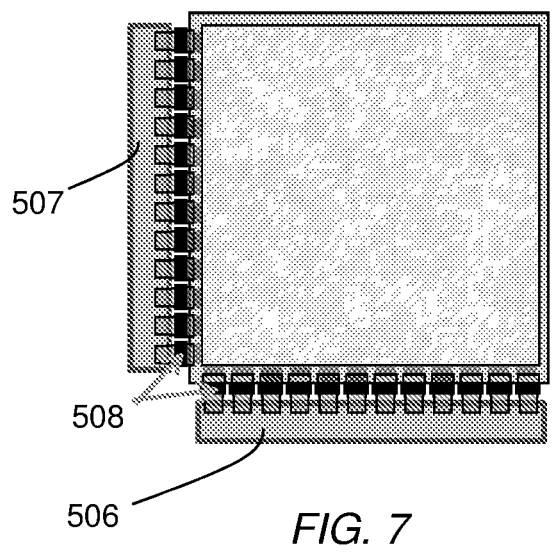
FIG. 7 is a schematic diagram of TAB attachment of readout electronics.

FIGS. 5-7 illustrate an exemplary prior art image sensor panel array 501 manufactured on a rigid glass substrate 502. The operation of the image sensor array 501 described herein below may be consistent with the image sensor array 12 described hereinabove. An ESD protection circuit 503 shorts together the TAB circuits and pads 504 during certain manufacturing steps. A scintillator layer 505 may be deposited on the array 501, after which the ESD protection circuit 503 is disconnected and the glass substrate 502 is cut to a desired size (FIG. 6). Read out electronic circuits in the form of an image readout circuit board 506 and a gate driver circuit board (or row address board) 507 are attached and electrically connected to the TAB (bond) pads 504 using chip-on-film (COF) connectors 508 (FIG. 7).

Figure 8:
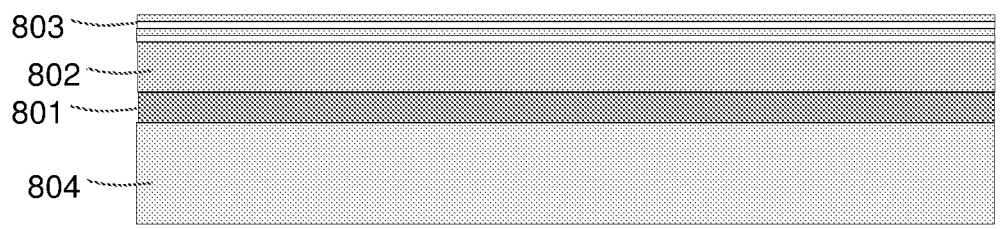
FIG. 8 is a schematic diagram of release, polyimide, and buffer layers coated or deposited on a glass carrier substrate.
Figure 9:
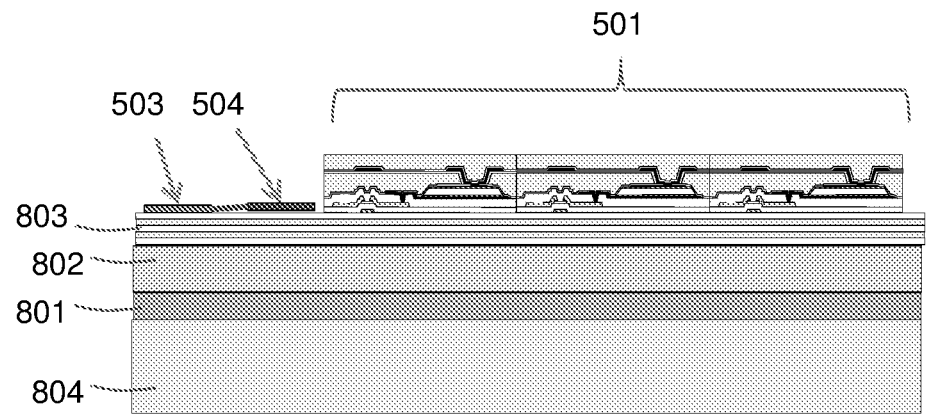
FIG. 9 is a schematic diagram of an image sensor array with an ESD protection circuit fabricated onto a PI buffer layer.
Figure 10:
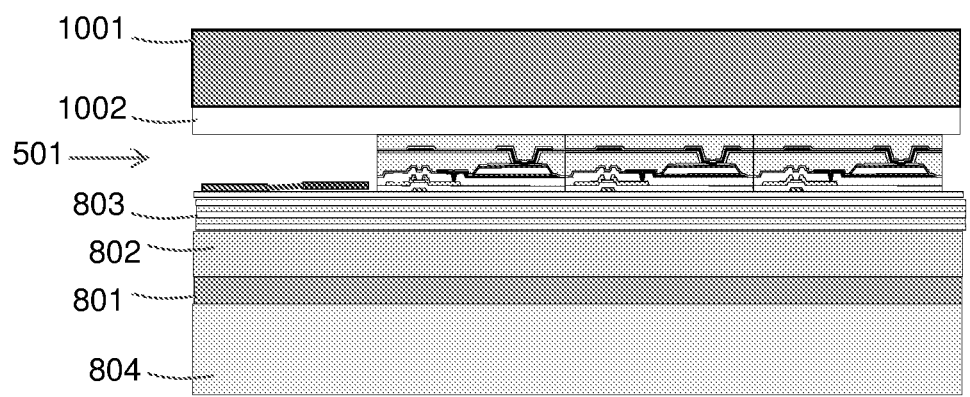
FIG. 10 is a schematic diagram of the image sensor array with ESD protection circuit temporarily attached to a holding fixture or substrate.
Figure 11:
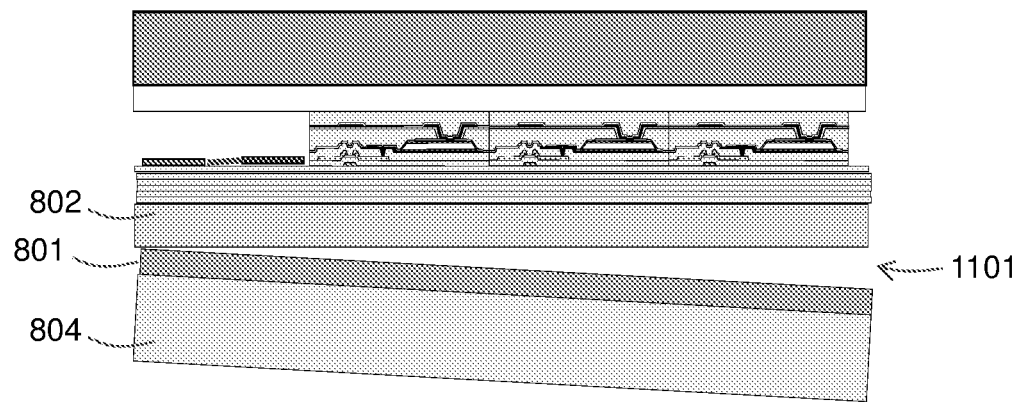
FIG. 11 is a schematic diagram of the glass substrate released from the PI buffer layer by laser exposure or mechanical peeling process.
Figure 12:
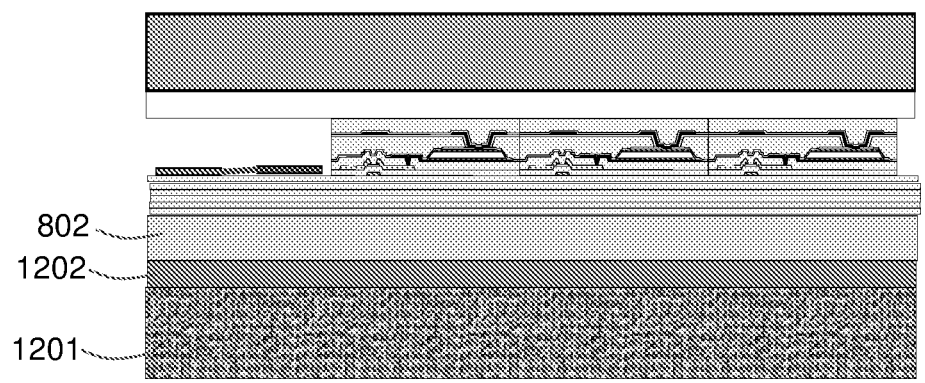
FIG. 12 is a schematic diagram of the flexible image sensor array layers laminated or attached to a secondary substrate.
Figure 13:
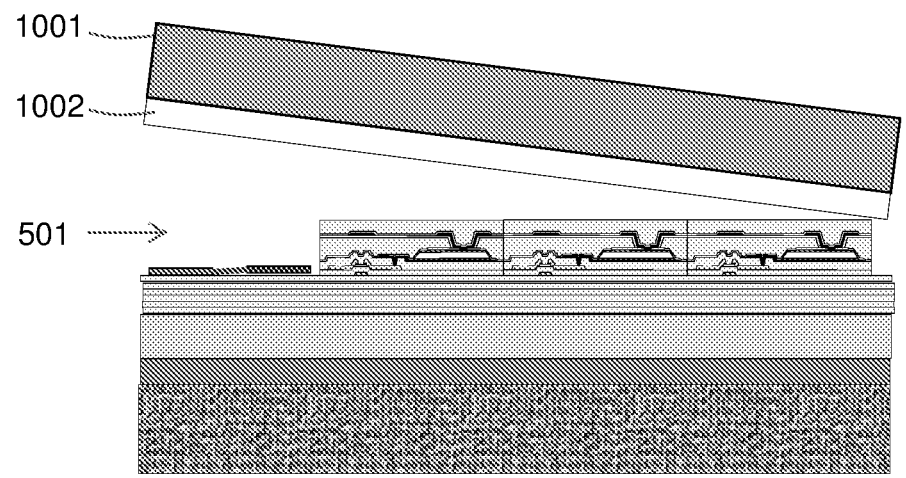
FIG. 13 is a schematic diagram of detaching the holding fixture or temporary substrate from image sensor array.
Figure 14:
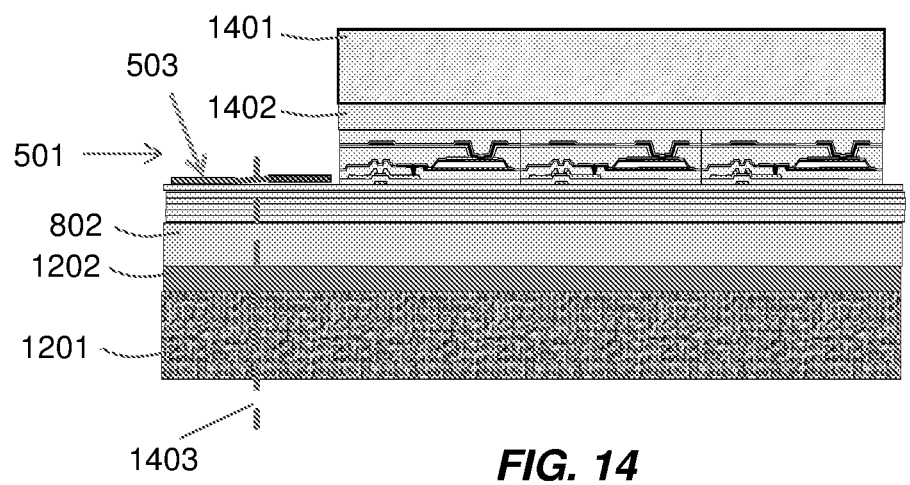
FIG. 14 is a schematic diagram of a scintillator layer deposited or laminated onto the buffer layer and ESD circuit and substrate cut line.
Figure 15:
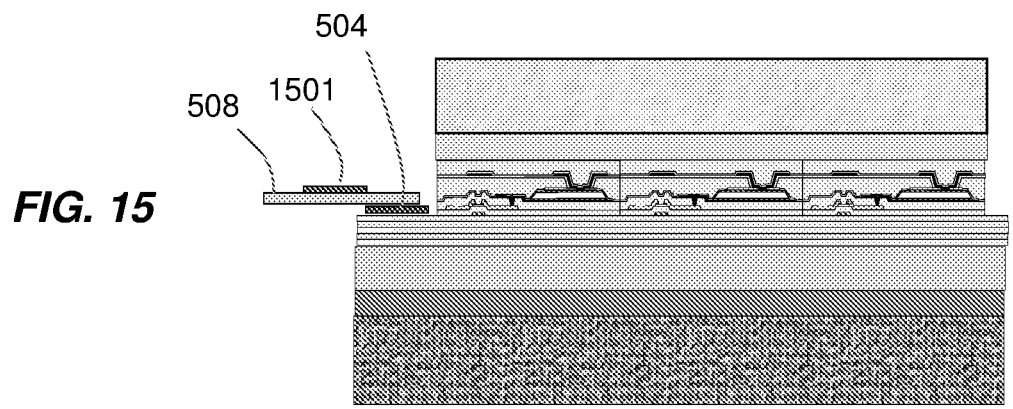
FIG. 15 is a schematic diagram of TAB attachment of readout electronics to the sensor panel.

FIGS. 8-15 describe sequential processing steps in the formation of a photosensor array on a flexible substrate using a secondary flexible substrate to attach COFs to bond pads. As shown in FIG. 8, a release layer 801, a high temperature polyimide 802 and a buffer layer 803 are fabricated, such as by coating, on a glass substrate, or carrier 804. The polyimide layer 802 and buffer layer 803 may be referred to herein as a first flexible substrate. As shown in FIG. 9, the image sensor array 501 with TAB pad 504 and ESD protection circuit 503 is fabricated onto the polyimide buffer layer 803. As shown in FIG. 10, a temporary substrate, or holding fixture, 1001 having a temporary adhesive layer 1002 thereon, is temporarily attached to the image sensor array 501. As shown in FIG. 11, the glass substrate 804 and the release layer 801 are removed from the polyimide layer 802 by mechanical peeling or via a laser exposure process. As shown in FIG. 12, a flexible secondary substrate 1201, having an adhesive layer 1202 thereon, is attached to the polyimide layer 802. The secondary substrate material may be selected such that its coefficient of thermal expansion is within about 5× that of the first substrate (polyimide and buffer layers). As shown in FIG. 13, the holding fixture 1001 and the temporary adhesive 1002 are detached from the image sensor array 501, leaving the first flexible substrate with image sensor array thereon supported by the flexible secondary substrate. As shown in FIG. 14, a scintillator layer 1401 may be deposited onto the image sensor array 501, or may be laminated onto the image sensor array 501 using an optically clear adhesive 1402. The ESD protection circuit 503 may be disconnected and the underlying layers and secondary substrate 1201 cut to a desired dimension along cut line 1403. As shown in FIG. 15, TAB attachment of the TAB pads 504 to readout electronics (not shown) is performed using COFs 508 having IC chips 1501 thereon. The image sensor array 501 thereby communicates image data captured therein to the readout electronics in the usual course.

Figure 16A:
FIG. 16A is a schematic diagram of an alternative secondary substrate with planarization and adhesive layers.
Figure 16B:
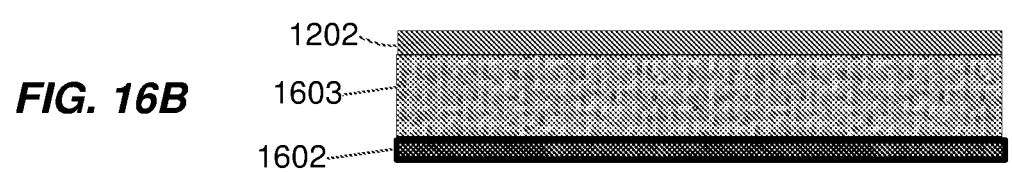
FIG. 16B is a schematic diagram of an alternative secondary substrate with an x-ray backscatter shield layer laminated thereon and/or high x-ray attenuation materials included in the secondary substrate.
Figure 16C:
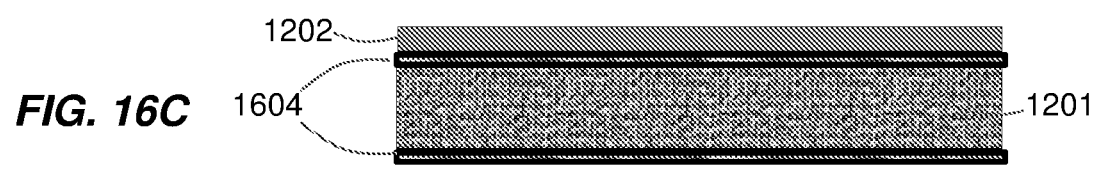
FIG. 16C is a schematic diagram of an alternative secondary substrate with electrically conductive and adhesive layers.

FIGS. 16A-16C illustrate alternative embodiments of the secondary substrate 1201 and adhesive layer 1202, which may be used in place of the embodiments described herein and illustrated in FIGS. 12-15. FIG. 16A illustrates a planarization layer 1601 that may be positioned between the adhesive 1202 and the secondary substrate 1201. FIG. 16B illustrates an optional backscatter shield layer 1602 laminated onto a bottom surface of the secondary substrate 1201. In another embodiment, high x-ray attenuating materials may be included in an alternative secondary substrate 1603. FIG. 16C illustrates optional one or two electrically conductive layers 1604 disposed at one or both major surfaces (top and bottom) of the secondary substrate 1201.

As will be described herein, method steps may be performed for fabricating a DR detector having a flexible substrate for the photosensor array whereby electrical connectors extend from the array layer assembly. The secondary substrate may include notches, scribed grooves, or perforations used to break off the secondary substrate edges at the notches, wherein the notches are outside the array region but inside the TAB bond region. The secondary substrate may include through holes (or vacuum channels) to establish vacuum ports for vacuum attach and holes/ports for camera illumination. A part of the surface of the secondary substrate may include an adhesive portion, two different adhesive portions, or adhesive portions and strengthened regions having denser material, for securing thereto the flex substrate which itself may support the active array region and bond pad regions.

Figure 17A:
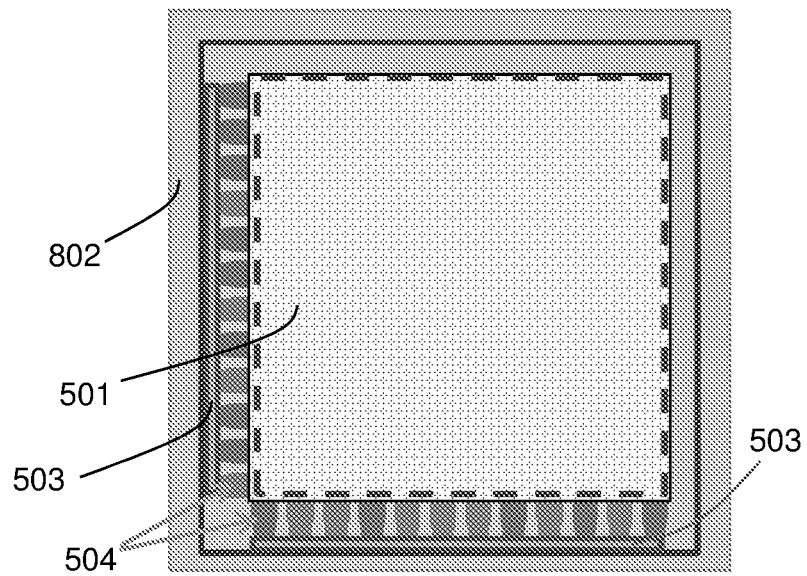
FIGS. 17A-H are schematic diagrams of a method of fabricating an image sensor comprising a PI Sensor on Glass Substrate (17A); secondary substrate with break-away sections outside sensor active area (17B); a side view of a flexible PI sensor array attached to a secondary substrate (17C); scintillator lamination or deposit (17D); singulating a module by cutting the shorting bar connection, release TAB pads from rigid carrier if adhered and breaking off outer sections of the secondary substrate (17E); a side view of the sensor integrated with scintillator and secondary substrate (17F); a schematic diagram of a complete module assembly with TAB attaches COF's and readout circuits/gate drivers (17G); a side view of the completed module with attached readout electronics (17H)
Figure 17C:
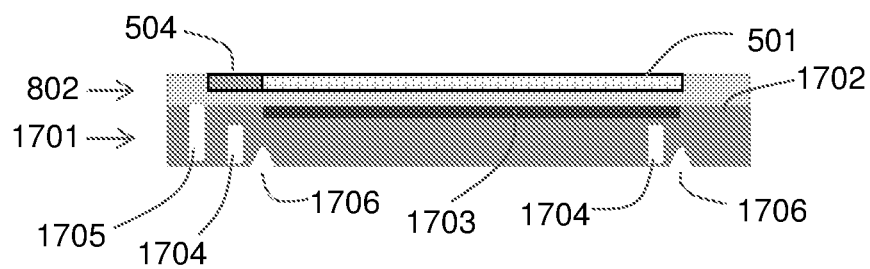
Figure 17B:
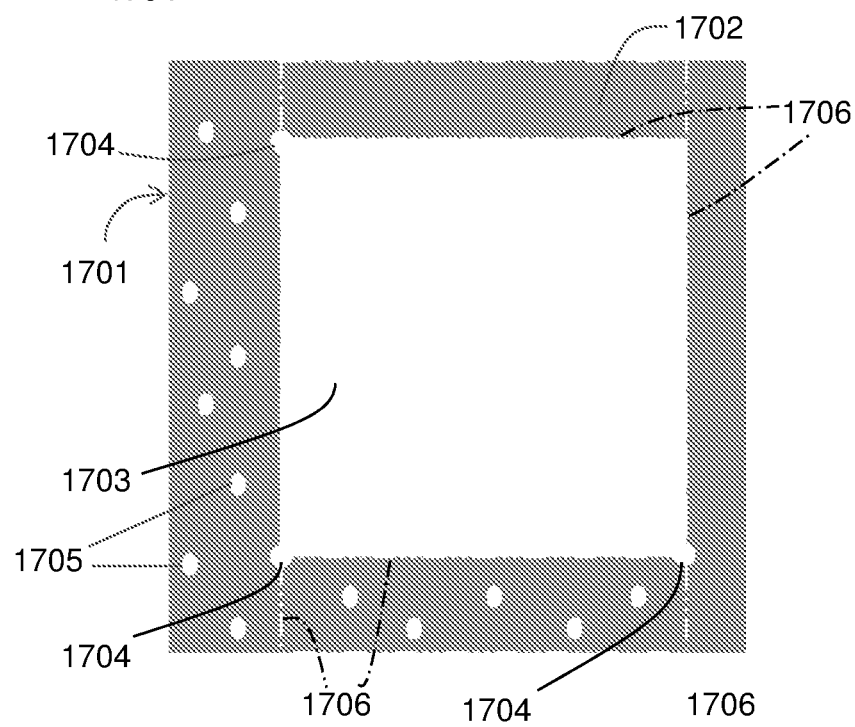

As shown in FIGS. 17A-H, a polyimide based flexible image sensor array 501 is fabricated as described herein. The high temperature polyimide 802 is formed on the glass substrate with a release layer therebetween, as described herein with reference to FIGS. 8-15. The sensor array 501 includes ESD protection circuit 503 and TAB bond pads 504 as described herein. Referring to FIG. 17B, an alternative secondary substrate 1701 is used in place of the secondary substrate 1201 described herein with reference to FIGS. 12-15. Secondary substrate 1701 includes areas 1702, that are not beneath the image sensor 501 area, wherein a low tack adhesive, a thermally releasable adhesive, or no adhesive may be used used. Secondary substrate 1701 may also include an area 1703, that is directly beneath the image sensor 501 area, wherein a permanent adhesive is disposed. It may be preferable to select a first adhesive for use in the area 1703 having greater adhesion, greater thermal tolerance, or a combination thereof, than a second adhesive (or no adhesive) selected for use in the areas 1702. Secondary substrate 1701 may further include camera illumination ports 1704 used during fabrication wherein placement of the secondary substrate 1701 relative to the image sensor array 501 may be controlled by viewing the image sensor array 501 corners or edges therethrough using a video camera. In one embodiment, the video camera may be positioned on a bottom side of the secondary substrate 1701 while the image sensor array 501 portion is movably maneuvered on the top side thereof. Secondary substrate 1701 may further include a plurality of vacuum ports 1705 that may be used to temporarily secure thereto the polyimide layer 802 that includes the image sensor array 501 thereon. A source of suction (vacuum source) may be applied to the vacuum ports such as at a bottom opening of the vacuum ports 1705 on a bottom surface of the secondary substrate 1701 to temporarily secure in position, by suction, the polyimide layer placed on a top surface of the secondary substrate 101 (with adhesive therebetween) having the top opening of the vacuum ports 1705 accessible therefrom. Alternatively, the vacuum ports 1705 may be accessible by a vacuum source via another channel through the secondary substrate 1701 other than through a bottom opening. Secondary substrate 1701 may further include a plurality of breakaway sections demarcated by breakaway lines 1706 formed by scoring or scribing a bottom surface of the secondary substrate 1701 whereby the breakaway sections may be separated from portions of the secondary substrate 1701 by bending the secondary substrate 1701 along the scribe lines 1706 to break off sections of the secondary substrate 1701.

Figure 17D:
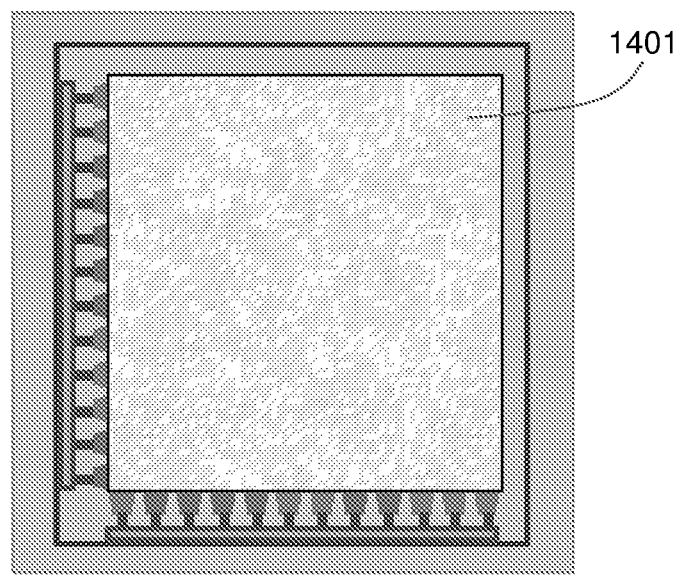
Figure 17E:
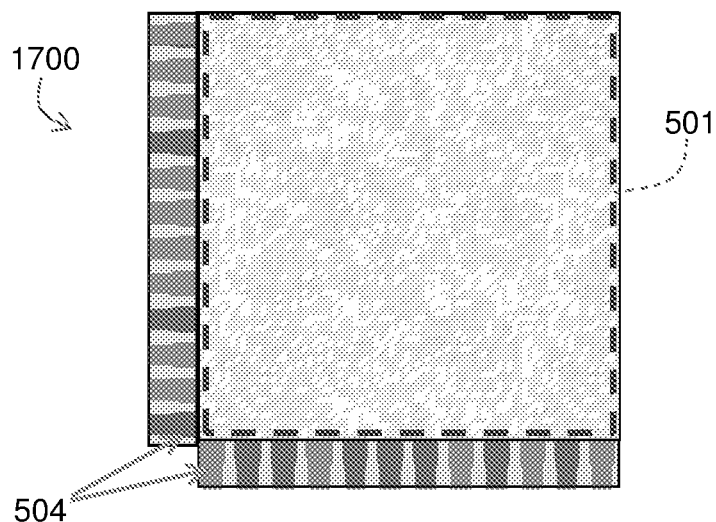
Figure 17F:
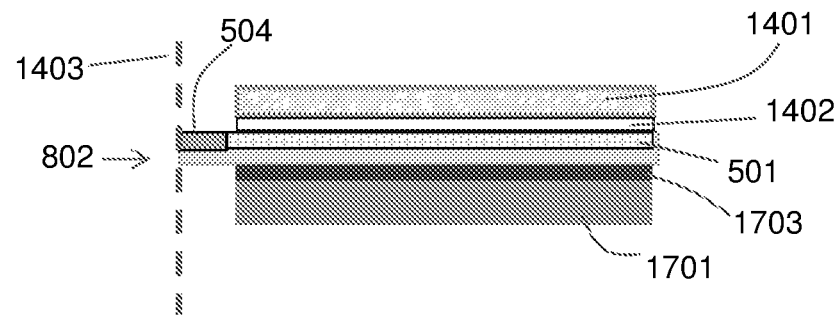
Figure 17G:
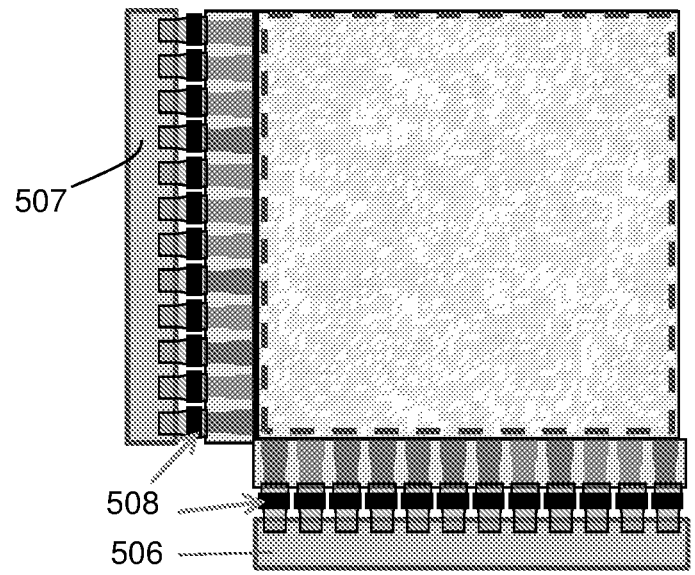
Figure 17H:
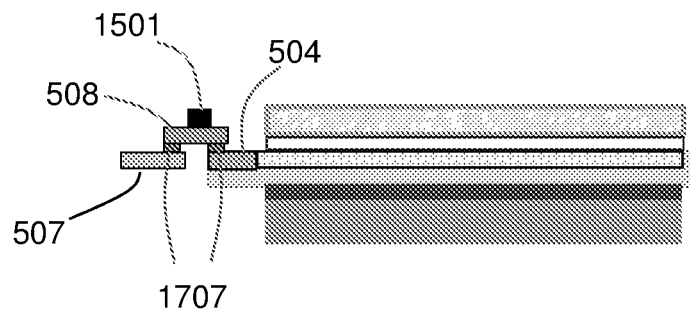

As shown in FIG. 17D, a scintillator layer 1401 is formed over the image sensor array 501 of FIG. 17A. As shown in FIGS. 17E-F, a module 1700 is formed by cutting the ESD protection circuits (bars) 503 as described herein along cut line 1403, breaking off the outer sections of the secondary substrate 1701 along breakaway lines 1706 and releasing the TAB pad regions 504 from the sections 1702 of the secondary substrate having low adhesion adhesive or no adhesive. This process results in an imaging module 1700 having TAB pads 504 extending from the imaging array 501 assembly. As shown in FIGS. 17G-H, read out electronics 506, 507, may be attached to the TAB pads 504 using COF modules 508 as described herein. The COFs 508 include IC chips 1501, and may be electrically connected to the TAB pads 504 and the read out electronics 507 using anisotropic conductive film 1707.

Figure 18A:
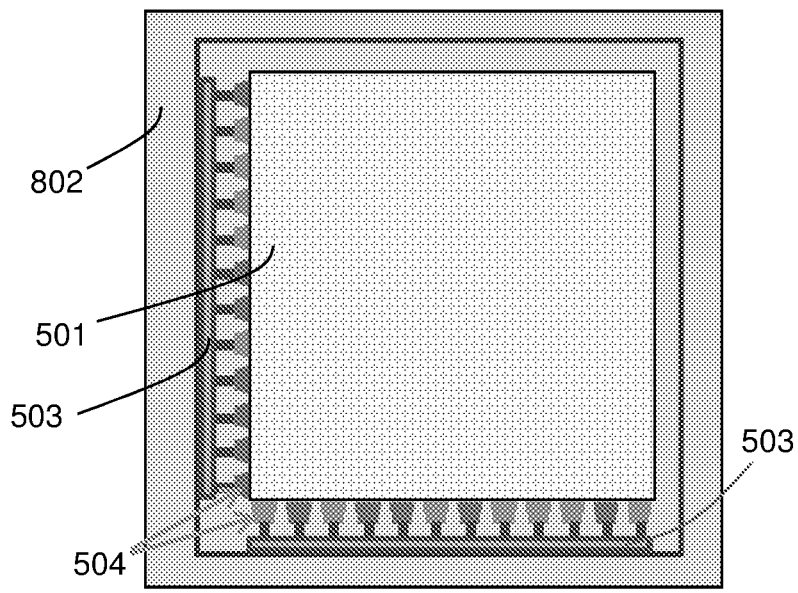
FIGS. 18A-F are schematic diagrams of a method of fabricating an image sensor comprising a PI Sensor on Glass Substrate; a schematic top view of a flexible PI sensor on a glass substrate (18A); a schematic top view of a secondary substrate with break-away sections outside sensor active area (18B); a schematic side view of a PI sensor array attached to a secondary substrate (18C); is a schematic top view of a scintillator laminated or otherwise attached to the sensor array (18D); a schematic top view of diagram of a singulated module formed by cutting an ESD protection circuit (shorting bar), and breaking off outer frame sections of the secondary substrate (18E); a side schematic view the sensor array integrated with the scintillator and secondary substrate (18F)
Figure 18C:
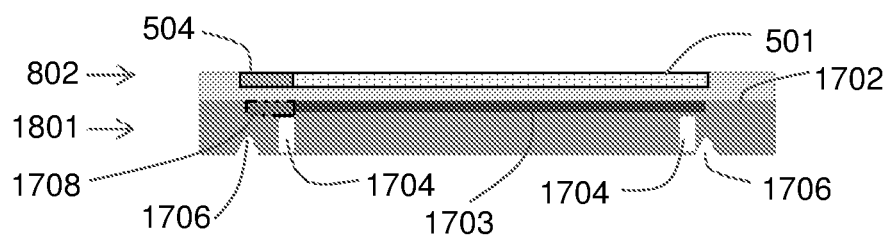
Figure 18B:
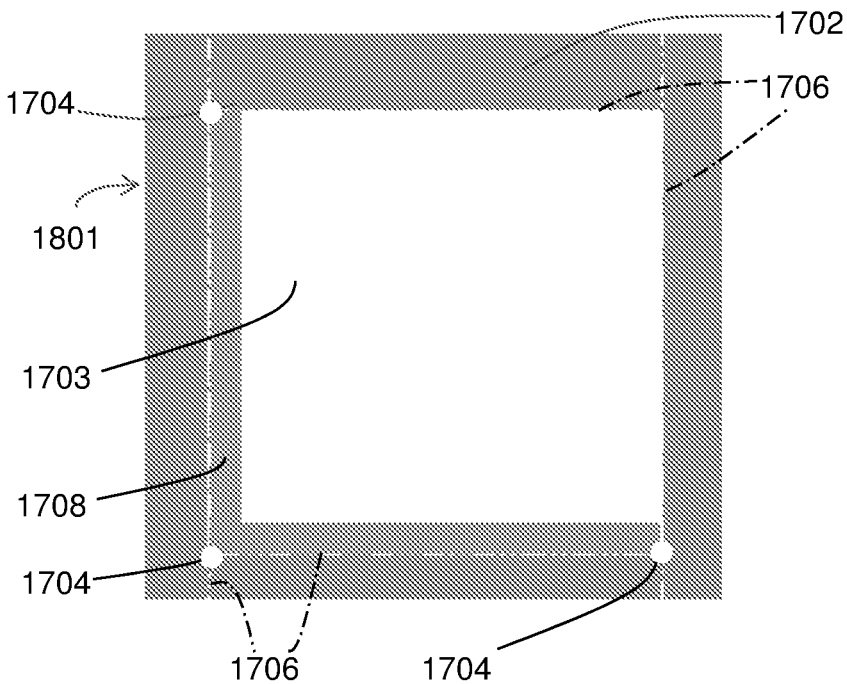
Figure 18D:
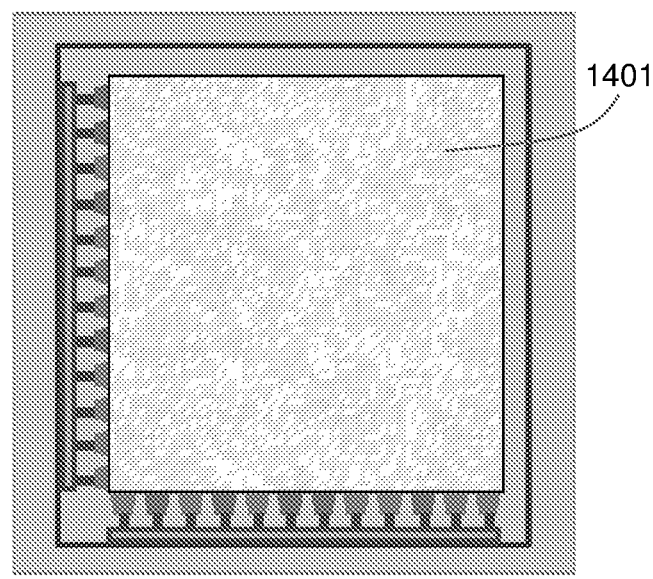
Figure 18E:
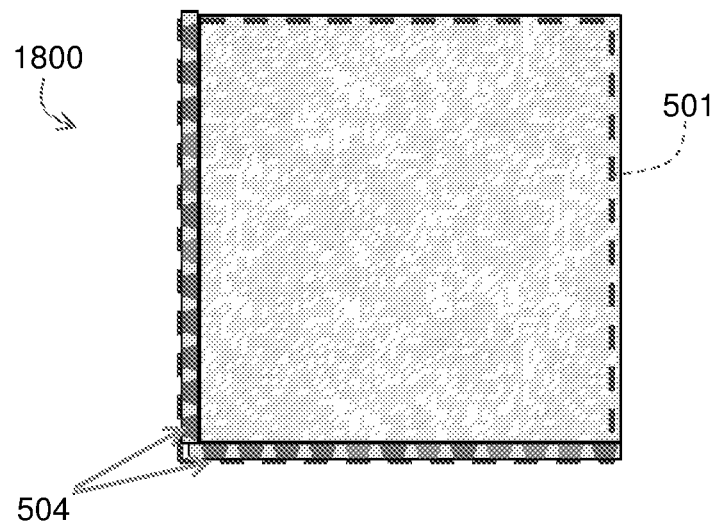
Figure 18F:
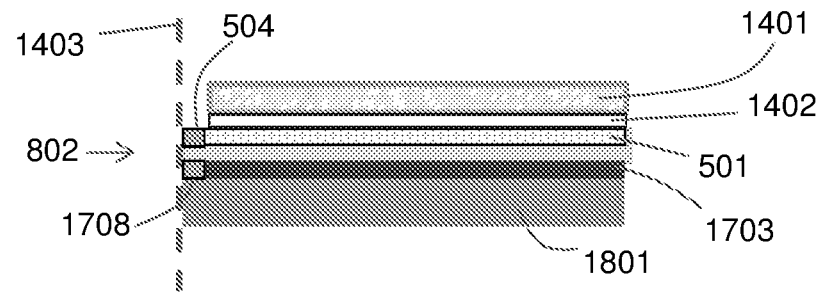
Figure 19A:
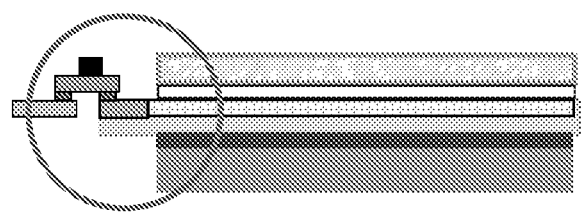
FIGS. 19A-19B are side views of extended bond pads.
Figure 19B:
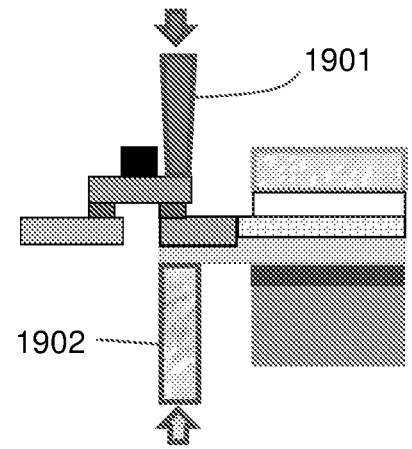
Figure 20A:
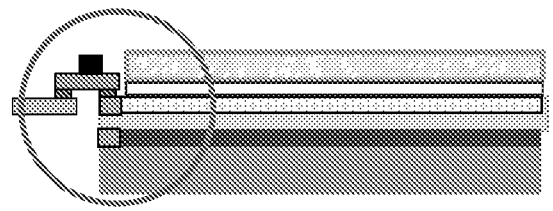
FIGS. 20A-20B are side views of bond pads over a secondary substrate with denser material portions.
Figure 20B:
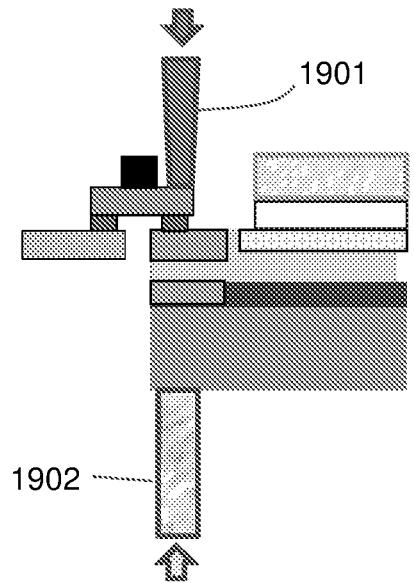

FIGS. 18A-F illustrate method steps for fabricating a panel DR detector having a flexible substrate for the photosensor image array whereby bond pads do not extend from the array structure and are supported by the flexible substrate layer and the secondary substrate (FIG. 18F). The secondary substrate may again include notches or scribes that used to break off the secondary substrate sections at the notches, wherein the notches are outside the array region and outside the TAB bond region, as can be seen in FIG. 18C. A part of the top surface of the secondary substrate may include a permanent adhesive portion, two different adhesive portions, e.g., low tack or no adhesive, and a denser region of the secondary substrate. One of the adhesive portions may be used to secure the flex substrate beneath the active array image region. Another of the adhesive portions may be used to secure thereto the flex substrate edge regions. The denser region, as described herein, may be located against the secondary substrate beneath the TAB bond pads to provide support for the high temperature and pressure conditions encountered during the TAB bonding process.

Referring to FIGS. 18A-F, and similar in certain respects to the fabrication method as shown in FIGS. 17A-H, a polyimide based flexible image sensor array 501 is fabricated as described herein. The high temperature polyimide 802 is formed on the glass substrate with a release layer therebetween, as described herein with reference to FIGS. 8-15. The sensor array 501 includes ESD protection circuit 503 and TAB bond pads 504 as described herein. Referring to FIG. 18B, an alternative secondary substrate 1801 is used in place of the secondary substrates 1201, 1701, described herein. Secondary substrate 1801 includes areas such as 1702, that are not beneath the image sensor 501 area, wherein a low tack adhesive, a thermally releasable adhesive, or no adhesive may be used. Secondary substrate 1801 may also include an area 1703, that is beneath the image sensor 501 area, wherein a strong permanent adhesive is disposed. Secondary substrate 1801 may also include portions 1708, that is not directly beneath the image sensor 501 area but is directly beneath the TAB bond pads 504 region which extends from the image sensor array 501 on two adjacent sides thereof, as shown in FIG. 18A. Portions 1708 of the secondary substrate 1801 may be formed from similar but denser material as compared to the material of secondary substrate 1801 directly adjacent thereto. Secondary substrate 1801 may further include camera illumination ports 1704 as described herein. Secondary substrate 1701 may further include a plurality of breakaway sections demarcated by breakaway lines 1706 formed by scoring or scribing a bottom surface of the secondary substrate 1701 whereby the breakaway sections may be separated from portions of the secondary substrate 1701 by bending the secondary substrate 1701 along the scribe lines 1706 to break off sections of the secondary substrate 1701.

As shown in FIG. 18D, a scintillator layer 1401 is formed over the image sensor array 501 of FIG. 18A. As shown in FIGS. 18E-F, a module 1800 is formed by cutting off the ESD protection circuits (bars) 503 as described herein along cut line 1403 and breaking off the outer sections of the secondary substrate 1701 along breakaway lines 1706 as illustrated in FIG. 18C. This process results in an imaging module 1900 having TAB pads 504 supported by the imaging array 501 assembly wherein the secondary substrate 1801 includes denser region 1708 beneath the bond pads 504. As described above with reference to FIGS. 17G-H, read out electronics 506, 507, may be attached to the TAB pads 504 using COF modules 508 as described herein.

FIGS. 19A-B and 20A-B illustrate in a close-up view a comparison of the two method and apparatus embodiments illustrated by FIGS. 17A-H and FIGS. 18A-F, the extended bond pads and the bond pads over secondary substrate, respectively. Cooperating bonding tool component heads 1901, 1902, apply heat and pressure in the directions indicated by the corresponding arrows. The denser secondary substrate region in the bond pads over secondary substrate embodiment may be better able to withstand the pressure and temperature stresses. With respect to embodiments described herein, for probe testing, test instrument probe contacts must align with sensor panel TAB pads as described herein. Fiducial marks on the panel may be used to align instruments to the pads via a video camera viewing system. Depending on the camera system design, illumination may be provided from underneath the panel substrate. For scintillator attachment, lamination may require use of an optically clear pressure sensitive adhesive film or fluid. Alternatively the scintillator can be directly vapor deposited or coated onto the image sensor array.

As described hereinabove, for TAB attachment, anisotropic conductive film may be used to connect the sensor panel TAB pads to the COF pads under heat and pressure, and can also be used to connect the COF circuit pads to the printed circuit board. In the case where the TAB pads are above the secondary substrate (FIGS. 18A-F), the entire stack of PI substrate TAB pads, adhesive layer, and secondary substrate must tolerate the high pressure and temperature of the bonding process. Fiducial marks on the panel are also used to align the pads to the COF pads via a camera viewing system. Depending on the camera system design, illumination may be provided from underneath the panel secondary substrate. The COF's can be replaced if it is determined that the IC thereon is defective.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A flexible digital radiographic image sensor comprising:
   an image sensor array formed on a top side of a flexible first substrate, the flexible first substrate having a bottom side opposite the top side; and a flexible second substrate having a top surface attached to the bottom side of the flexible first substrate opposite the image sensor array, wherein the top surface of the flexible second substrate comprises a first portion and a second portion, the first portion having a first adhesive thereon, the first adhesive contacts the bottom side of the flexible first substrate only in an area directly opposite the image sensor array, the second portion comprises no adhesive or a second adhesive having less adhesion than the first adhesive, and wherein the second portion contacts the bottom side of the flexible first substrate in an area outside the area directly opposite the image sensor array.

2. The image sensor of claim 1, wherein a coefficient of thermal expansion of the second substrate is within about 5× that of the first substrate.

3. The image sensor of claim 2, further comprising a plurality of bonding pads on the first substrate, the bonding pads disposed adjacent to and along at least one edge of the image sensor array and electrically connected to the image sensor array.

4. The image sensor of claim 3, wherein the flexible first substrate and the bonding pads thereon extend beyond an outer edge of the second substrate during a process of connecting electrical components to the bonding pads.

5. The image sensor of claim 1, wherein the second substrate further comprises a backscatter shield on a bottom surface thereof.

6. The image sensor of claim 1, wherein the second substrate further comprises one or more separate electrically conductive layers, and wherein one electrically conductive layer is disposed on a bottom surface of the second substrate.

7. The image sensor of claim 1, wherein the second substrate further comprises a scribed break line on a bottom surface thereof opposite the top surface, the scribed break line located outside the area directly opposite the image sensor array.

8. The image sensor of claim 3, wherein the second substrate further comprises a scribed break line, the break line located inside an area beneath the bonding pads.

9. A flexible digital radiographic image sensor comprising:
   an image sensor array formed on a flexible first substrate;
   bonding pads on the first substrate, the bonding pads electrically connected to the image sensor array; and
   a flexible second substrate attached to the first substrate on a side opposite the image sensor array, the second substrate comprising a top surface having a first adhesive only in a first portion thereof wherein the adhesive portion contacts the first substrate in an area directly opposite the image sensor array,
   wherein a coefficient of thermal expansion of the second substrate is within about 5× that of the first substrate, the top surface of the second substrate comprises a non-adhesive denser material in a second portion thereof different than the first portion, and wherein the denser material contacts the first substrate in an area directly beneath the bonding pads.

10. The image sensor of claim 9, wherein the denser material is configured to maintain contact with the first substrate in an area beneath the bonding pads during a TAB attachment process to the bonding pads.

11. The image sensor of claim 9, wherein the bonding pads are disposed adjacent to and along at least one edge of the image sensor array.

12. The image sensor of claim 9, wherein the flexible first substrate and the bonding pads thereon extend beyond an outer edge of the second substrate during a process of connecting electrical components to the bonding pads.

13. The image sensor of claim 9, wherein the second substrate further comprises a backscatter shield on a bottom surface thereof.

14. A flexible digital radiographic image sensor comprising:
   an image sensor array formed on a flexible first substrate; and
   a flexible second substrate attached to the first substrate on a side opposite the image sensor array, the second substrate comprising a top surface having a first adhesive only in a first portion thereof wherein the adhesive portion contacts the first substrate in an area directly opposite the image sensor array
   wherein the top surface comprises a second adhesive in a second portion thereof, the second adhesive comprises weaker adhesion strength than the first adhesive, and wherein the second adhesive contacts the first substrate proximate the outer edges of the first substrate.

15. The image sensor of claim 14, wherein the first adhesive comprises a greater thermal tolerance than the second adhesive.

16. The image sensor of claim 14, wherein the second adhesive comprises a UV releasable adhesive.

17. The image sensor of claim 14, further comprising bonding pads on the first substrate, the bonding pads electrically connected to the image sensor array.

18. The image sensor of claim 17, wherein the bonding pads are disposed adjacent to and along at least one edge of the image sensor array and electrically connected to the image sensor array.

19. The image sensor of claim 14, wherein the second substrate further comprises a backscatter shield on a bottom surface thereof.

20. The image sensor of claim 14, wherein the second substrate further comprises a scribed break line on a bottom surface thereof.

* * * * *